US005863336A

United States Patent [19]

Tkaczyk et al.

[11] Patent Number: 5,863,336

[45] Date of Patent: Jan. 26, 1999

[54] APPARATUS FOR FABRICATION OF SUPERCONDUCTOR

[75] Inventors: John Eric Tkaczyk, Delanson; John Anthony Deluca, Burnt Hills, both of N.Y.; Pamela Lynn Karas, Westerville, Ohio

[73] Assignee: General Electric Company, Schenectady, N.Y.

[21] Appl. No.: 631,286

[22] Filed: Apr. 8, 1996

[51] Int. Cl.$^{6}$ .......... C23C 16/00

[52] U.S. Cl. .......... 118/718; 118/719; 118/725; 118/726; 505/473

[58] Field of Search .......... 118/718, 197, 118/725, 726; 505/473

[56] References Cited

U.S. PATENT DOCUMENTS

| | | | |
|---|---|---|---|
| 3,198,167 | 8/1965 | Bakish | 118/718 |
| 3,785,853 | 1/1974 | Kirkman | 118/719 |
| 4,430,149 | 2/1984 | Kirkman | 118/718 |
| 4,890,574 | 1/1990 | Sarin | 118/726 |
| 5,149,376 | 9/1992 | Fournes | 118/726 |
| 5,254,210 | 10/1993 | Jones | 118/726 |
| 5,312,490 | 5/1994 | Wilkinson | 118/719 |
| 5,489,573 | 2/1996 | DeLuca et al. . | |

FOREIGN PATENT DOCUMENTS

| | | |
|---|---|---|
| 398374 | 11/1990 | European Pat. Off. . |
| 447260 | 9/1991 | European Pat. Off. . |
| 3827069 | 6/1989 | Germany . |

OTHER PUBLICATIONS

Hanfmann, Solid State Technology, Dec. 1968, pp. 37–41.

"Forming Superconducting T1–Ca–Ba–Cu O Thin Films by the Diffusion Method" by R.J. Lin and P.T. Wu, Japanese Journal of Applied Physics, Vo. 28, No. 1, Jan. 1989, pp. L85–L87.

"Bulk superconductivity at 120K in the T1–Ca/Ba–Cu–O System" by Z.Z. Sheng and A.M. Hermann, Dept. of Physics, University of Arkansas, Fayetteville, Ark. 72701–pp. 138–139.

"The Synthesis of Superconducting T1–Ca–Ba–Cu–oxide Films by the Reaction of Spray Deposited Ca–Ba–Cu–oxide Precursors With T120 Vapor in a Two–Zone Reactor" by J.A. Deluca, M.F. Garbauskas, R.B. Bolon, J.G. McMullen, W.E. Balz and P.L. Karas, J. Mater. Res. vol. 6, No. 7, Jul. 1991, pp. 14151424.

"The Preparation of 1223 Tl–Ca–Ba–Cu–oxide Superconducting films via the Reaction of Silver–Containing Spray Deposited Ca–Ba–Cu–oxide With Thallium Oxide Vapor", J.A. DeLuca, P.L. Karas, J.E. Tkacyzk, P.J. Bednarczyk. M.F. Barbauskas, C.. Briant, D.B. Sorensen, Physica C 205, (1993), pp. 21–31.

"Multilayer Deposition of T1–Ba, Ca–Cu–O Films" by I. Shih and C.X Qiu, Appl. Physics Letters 53 (6), 8 Aug. 1988, pp. 523–525.

"Formation of T1–Ca–Ba–Cu–O Films by Diffusion of T1 Into RF–Sputtered Ca–Ba–CuO" C.X. Qui and I Shih, Appl. Phys. Letters 53 (2), 19 Sep. 1988, pp. 112–1124.

*Primary Examiner*—Richard Bueker
*Attorney, Agent, or Firm*—Noreen C. Johnson

[57] ABSTRACT

An apparatus for thallium-containing superconductor with grains having c-axis alignment perpendicular to the plane of the substrate is fabricated by controlling the thallium oxide vapor partial pressure during the steps of warming the precursor, reaction soaking the precursor with the thallium oxide vapor, and cooling the thallium-containing precursor in a thallium oxide vapor below about $10^{-3}$ atmospheres.

15 Claims, 2 Drawing Sheets

15
19
600C
18
25
22
730°C
21
860C
26
$Tl_2O_3$
21
16
17
27
23
24
600C
20

APPARATUS FOR FABRICATION OF SUPERCONDUCTOR

FIELD OF THE INVENTION

This invention relates to an apparatus for preparing a superconducting conductor having high critical currents at elevated temperatures and in the presence of magnetic fields. In particular, this invention relates to apparatuses for continuous preparation of thallium-containing superconductors having biaxial alignment of the crystalline microstructure.

BACKGROUND OF THE INVENTION

Oxide superconductors hold promise for achieving significant improvements in the efficiency, size, and weight of a wide variety of electrical equipment, such as motors, generators, transformers, magnets, and transmission lines. For many of these applications considerable lengths of conductor must be fabricated that have critical current densities of at least $10^4$–$10^5$ A/cm$^2$ in magnetic fields of one tesla (T) or greater at operation temperature. The need to produce large quantities of conductors economically has stimulated effort worldwide to develop processes for fabricating polycrystalline wires and tapes from oxide superconductors belonging to the Y-Ba-Cu-oxide (YBCO), Bi-Ca-Sr-Cu-oxide (BCSCO), and Tl-Ca-Ba-Cu-oxide (TCBCO) families. Key to the success of this work is the ability to prepare polycrystalline conductors which have both excellent intergranular connectivity and excellent magnetic flux pinning characteristics.

Methods of preparing thallium system superconductors are documented in the literature. One method of preparation is reported in "Bulk Superconductivity at 120 K in the Tl-Ca-Ba-Cu-O System," Z.Z. Sheng and A.M. Hermann, Nature Vol. 332, Mar. 10, 1988, pp. 138–139. Briefly described, appropriate amounts of powdered Tl203, CaO, and $BaCu_3O_4$ were mixed, ground, and pressed into pellets. The pellets were heated in a furnace at 880°–910° C. with an oxygen flowing atmosphere for three to five minutes. After heating, the pellets were quenched to room temperature in air or furnace cooled to room temperature. Basically, the pellets were reaction sintered by the heat treatment, forming a superconducting conductor.

Thin films of thallium superconductors have also been made by sequential thermal evaporation, sequential electron beam evaporation, and spray pyrolysis of nitrate solutions containing the precursor cations, such as calcium, copper, and barium. A limitation for these methods is the time needed to deposit a layer about 10–100 gm of the precursor deposit on the substrate.

The above-mentioned sintered ceramic pellets, thin films, and spray pyrolysis nitrate solutions are subsequently treated by heating in flowing air or oxygen at temperatures of about 800–900° C. to form the superconducting compositions. A drawback for these systems is that thallium oxide has an appreciable vapor pressure at the temperature required to form the superconductor. As a result, thallium can be vaporized during the 800–900° C. annealing temperatures leading to the loss of thallium from the superconductor.

A further drawback to the above methods of making thallium superconductors is that low current carrying capacity occurs when the grains are weakly linked or poorly connected. Generally, the superconducting films have a non-textured microstructure with poor critical current. Often the grains have the c-axis parallel to the substrate surface.

To achieve high current carrying capacity in thallium superconductors, the microstructure of the superconductor needs to have strongly aligned crystal microstructure with the c-axis perpendicular to the plane of the substrate. In the past, methods and apparatuses have not disclosed the means of making continuous long lengths of thallium superconductors that achieve the desired microstructure for high current carrying capacity.

Recently, a method for making high critical current and high critical current density thallium superconductors having the c-axis perpendicular to the plane of the substrate has been disclosed in commonly owned and assigned U.S. patent application, Ser. No. 08/537,578, incorporated herein by reference.

Thus, there is a need for an apparatus to fabricate continuously long lengths of thallium-containing superconductors that produces a uniform superconducting phase and microstructure over long lengths of superconductor material with the c-axis aligned perpendicular to the plane of the substrate. There is an additional need for an apparatus to fabricate long lengths of superconducting conductors rapidly and economically by continuous and batch processes. The long lengths of thallium superconductor can be used for magnet and transmission applications, to mention a few.

SUMMARY OF THE INVENTION

In accordance with this invention, an apparatus is provided for fabricating a polycrystalline thallium-containing superconductor having biaxial alignment of its polycrystalline, textured microstructure that achieves critical current and critical current density over continuous lengths of the thallium superconductor. A substrate, such as a tape or wire, that is coated with a precursor material, is passed through an arrangement of tubes and slits within a furnace that provides the correct sequence of temperatures and atmospheres in order to convert the precursor material into the thallium superconductor in a continuous and manufacturing way.

An aspect of the invention is an apparatus for making thallium-containing superconductors comprising: a reactor for accomodating a plurality of articles; a precursor warming zone in an anterior position of said reactor; a reaction chamber, having a slit at an anterior position and a slit at a posterior position, operatively connected to the reactor and positioned centrally in the reactor and proximate to said precursor warming zone, for reacting thallium oxide vapor with a substrate coated with a precursor; a thallium flow tube having an anterior open end proximate to the anterior of the reaction chamber, operatively connected and positioned within the reaction chamber; a thallium source positioned in the thallium flow tube; impermeable heating means operatively positioned proximate to the precursor warming zone, the reaction soak zone, and the thallium source; means for flushing the precursor warming zone with oxygen; and means for flow of oxygen carrier gas for thallium oxide vapor in the thallium flow tube.

The apparatus provides a system to form a thallium-containing superconductor comprising: a reactor having a precursor warming zone, a reaction soak zone, and a cooling zone; a heating means, operatively positioned in a reactor, for warming to about 860° C.±5° C., in a precursor warming zone of the reactor containing oxygen and substantially free of a thallium oxide vapor, a substrate coated with a precursor of Ba-Ca-Cu-O or Sr-Ca-Cu-O and silver, said silver in an amount between 1–20 mole percent silver metal in the precursor, and said Ba-Ca-Cu-O or Sr-Ca-Cu-O in a stoichiometric amount to form the thallium-containing superconductor; means, operatively positioned in the reactor, for passing the substrate coated with the precursor through a slit into a reaction chamber containing oxygen and the thallium oxide vapor, said thallium oxide vapor at a partial vapor pressure of about $5\times10^{-4}$ to $5\times10^{-3}$ atmospheres, to react the substrate containing the precursor with the thallium oxide vapor for a sufficient amount of time to form the thallium-containing superconductor; and means for cooling the thallium-containing superconductor in zone 3 to below about 600° C. with the thallium oxide vapor below about $10^{-3}$ atmospheres.

The apparatus insures the appropriate exposure of the substrate coated with the precursor to the thallium oxide partial pressure during the three steps of warming, reacting, and cooling. The term substantially free of thallium oxide vapor means that the thallium oxide vapor is less than about $10^{-4}$ atmospheres.

The apparatus of this invention provides long lengths of continuous thallium superconductor and prevents the nucleation and growth of thallium-containing superconducting grains with their c-axis parallel to the plane of the substrate. This occurs by choosing the appropriate thallium oxide vapor pressure during each step of the process. The steps where the thallium oxide vapor partial pressure is controlled are: warming the substrate coated with the precursor in zone 1, reaction soaking the substrate coated with the precursor with the thallium oxide vapor in zone 2, and cooling the thallium-containing superconductor in zone 3. Thus, the desired granular alignment of the grains with the c-axis aligned perpendicular to the plane of the substrate in the thallium-containing superconducting films is obtained through the control of the thallium oxide vapor pressure during the fabrication of a long length of tape or wire.

An advantage of this invention is that by controlling the thallium oxide vapor during the warming, soaking, and cooling stages of the superconductor fabrication, the nucleation of grains with c-axis perpendicular to the substrate surface is achieved. As a result, the textured microstructure of the thallium-containing superconductor yields high critical current and critical current density over long lengths of tape or wire in an economically short period of time.

DESCRIPTION OF THE INVENTION

Figure 1A:
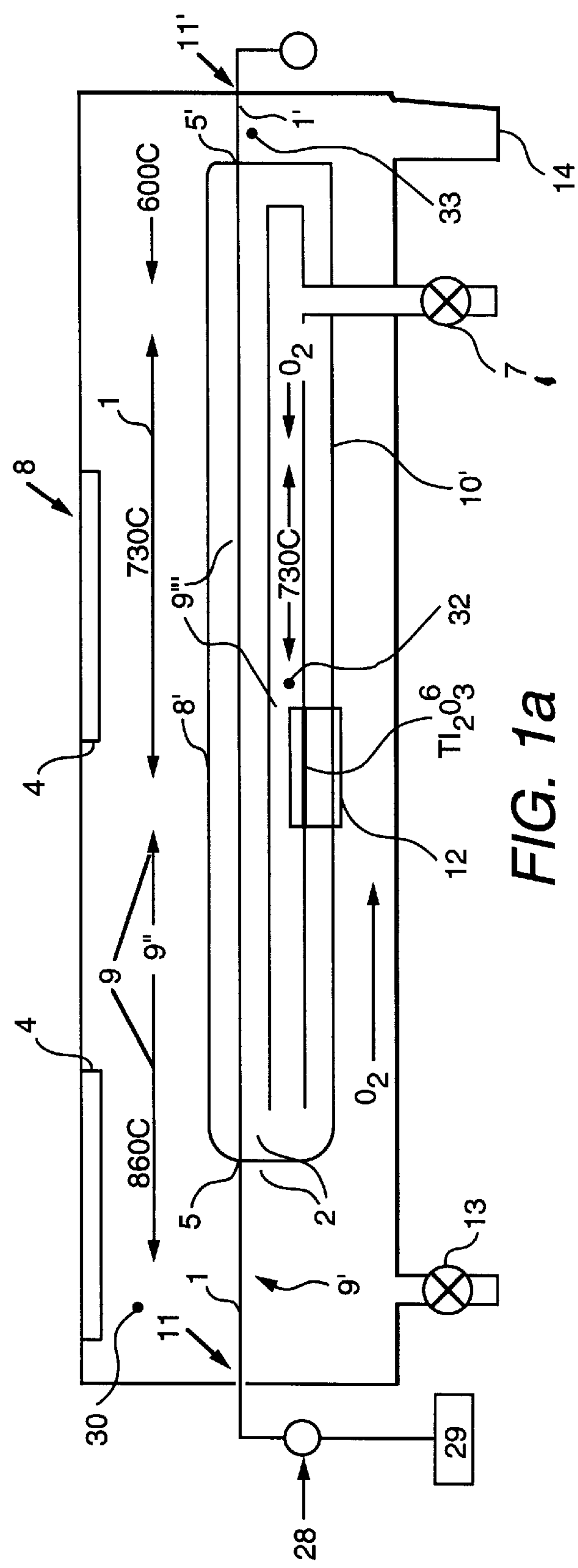
FIGS. 1*a* and 1*b* depict schematic diagrams of a single slit (1*a*) and double slit (1*b*) apparatus for processing long lengths of tape or wire coated with the precursor with thallium.

Textured thallium-containing superconductors are formed by the reaction of precursor films at about 860° C., plus or minus 5° C., with thallium oxide ($Tl_2O$) vapor in a multi-zone reactor. A source of thallium oxide vapor is the compound $Tl_2O_3$. The textured microstructure of the superconductor is achieved by delaying the precursor's exposure to the thallium oxide vapor until the precursor is completely warmed to about 860° C. Likewise, after reaction soaking the precursor with the thallium oxide vapor to incorporate the thallium into the precursor, the subsequent cooling stage of the thallium-containing superconductor is done at a lower thallium oxide vapor pressure than the reaction soak step.

The following definitions are applicable to the present invention. The term "thallium-containing superconductor", as used herein, refers to a species that is capable of superconductivity and contains thallium. Said species can include, but are not limited to, wires, rods, tapes, and flat sheets, where wires and rods are cylindrical objects with a diameter having a round cross-section, and tapes and flat sheets are flat objects with width, length, and thickness dimensions having a rectangular or square cross-section. Examples of thallium-containing compounds are thallium-barium-calcium-copper oxides with formulas such as $TlBa_2Ca_2Cu_3O_9$ (known as <1223>phase), $Tl_2Ba_2CaCu_2O_8$ (known as <2212>phase), and $Tl_2Ba_2Ca_2Cu_3O_{10}$ (known as <2223>phase), and thallium-strontium-calcium-copper oxides with formulas such as $TlSr_2Ca_2Cu_3O_9$ (known as <1223>phase), $Tl_2Sr_2CaCu_2O_8$ (known as <2212>phase), and $Tl_2Sr_2Ca_2CU_3O_{10}$ (known as <2223>phase). This invention applies to thallium-containing superconductors and is not limited to the above mentioned examples.

The term "substrate", as used herein, refers to flexible and rigid substrates, upon which a precursor is deposited on the outer surface. The precursor on the substrate surface is also referred to herein as "a substrate coated with the precursor" or as "a coated substrate" or a "precursor substrate". In cases where tapes or flat sheets are used, the precursor may be deposited on one side or both sides, depending on the engineering requirements. On wires or rods, the precursor is deposited on the complete outer cylindrical surface. Flexible substrates are preferred. Examples of the composition of the substrate include oxygen resistant metals, such as silver, gold, platinum, palladium; high temperature alloys known in the art, such as nickel-chromium-aluminum, cobalt-chromium-aluminum, iron-chromium-aluminum alloys, and mixtures thereof; along with ceramic compositions, such as lanthanum aluminate, strontium titanate, magnesium oxide, and chemically stabilized zirconias, including yttria-stabilized zirconia, scandia-stabilized zirconia, calcia-stabilized zirconia, hafnia-stabilized zirconia, and magnesia-stabilized zirconia. The preferred surface finish of the substrate may be smooth so as to promote the granular alignment in the reacted deposit.

The term "precursor", as used herein, refers to an admixture containing the stoichiometric amount of cations that are part of the final superconducting conductor, with the exception of thallium. Thallium is later incorporated into the precursor by vapor phase thallination. Examples of such cations are the group barium, calcium and copper, which upon completion of the process of this invention, form the thallium-barium-calcium-copper oxide superconductor, or strontium, calcium, and copper cations which later form the thallium-strontium-calcium-copper oxide superconductor.

The stoichiometric amount of cations desired in the precursor is related to the desired superconductor to be fabricated. For instance, to form $TlBa_2Ca_2Cu_3O_9$, a powder precursor, such as $Ba_2Ca_2Cu_3O_7$, would be used. The precursor admixture can include individual compounds, such as calcium oxide, barium oxide, and copper oxide, so long as the correct stoichiometric amounts of cations that form the desired thallium-containing superconductor are present.

It is pointed out that silver may be a part of the desired precursor composition, and is in fact, preferred. It has been found that improved thallium-containing superconductors can be formed by providing from about 1 to 20 mole percent silver metal in the precursor during the thallium reaction and formation of the thallium superconductor. The amount of silver required is calculated as a mole percent based on the total moles of cation present in the precursor, excluding thallium. The role of silver in the precursor is the subject of commonly assigned and owned U.S. Pat. No. 5,489,773, filed Aug. 16, 1994, and titled "THALLIUM-CALCIUM-BARIUM-COPPER-OXIDE SUPERCONDUCTOR WITH SILVER AND METHOD". The preferred amount of silver is about 2 to 12 mole percent of the total cations present in the precursor. The silver is incorporated in the precursor as a silver-containing species, such as elemental silver, silver nitrate, or silver oxide. Silver may also be derived from a silver-containing substrate or a silver-coated substrate.

The individual compounds containing the cations do not necessarily have to be oxides. They can be nitrates, carbonates, and other decomposable compounds that provide the correct stoichiometric amount of the desired cation. A "decomposable compound" is one that decomposes, such as by evaporation or by a furnace bake, where after the decomposition process, only the cations and oxides needed for the superconductor remain as part of the precursor.

Deposition of the precursor onto a substrate can be accomplished using techniques known in the art, such as spray pyrolysis, dip coating, or tape casting of a slip. The slip contains the precursor powder mixed with a solvent and other ingredients used to maintain the powder in suspension and control the viscosity. The viscosity, based on common engineering principles, controls the thickness of the precursor deposit. The solvent and additional ingredients in the precursor mixture, such as carbonates, nitrates, binders, and the like, need to be driven from the precursor deposit prior to the reaction soak step. This can be accomplished by decomposition in a furnace bake-out.

The term "soaking" or "reaction soak", as used herein, refers to the addition of the stoichiometric amount of thallium to the precursor deposit. This is accomplished by exposing the precursor deposit at a temperature between about 840°–930° C., for a given time dependent on its thickness, to a thallium-containing vapor. A precursor deposit of about 10 $\mu$m thick requires about one hour of exposure to a thallium vapor to achieve a thallium-containing superconductor. The preferred reaction soak temperature is about 860° C.±5° C.

By "thallium oxide vapor" is meant that a gaseous phase of thallium and oxygen, about one atmosphere oxygen and about $5\times10^{-4}$ to about $5\times10^{-3}$ thallium oxide, is passed over the precursor deposit. The source of the thallium oxide vapor is controlled in a separate zone of the reactor. It it important to note that the thallium oxide vapor is introduced to the precursor only after the precursor is heated to about 860° C.±5° C. The thallium oxide vapor is excluded from the zone of the reactor housing the substrate and precursor until the precursor is warmed to the reaction soak temperature, about 860° C.±5° C.

Varying partial pressures of thallium oxide are employed depending on the temperature of the source of thallium oxide. For instance, when the thallium oxide source is heated to 700° C., the partial pressure of thallium oxide is about $2\times10^{-4}$ atmospheres, and when the thallium oxide source material is heated to 780° C., the corresponding partial pressure is about $10^{-2}$ atmospheres. The preferred temperature for heating the thallium oxide source is between about 720°–730° C. with a thallium oxide vapor partial pressure of about $5\times10^{-4}$ to about $5\times10^{-3}$ atmospheres. It should be noted that a lower temperature is utilized to vaporize the thallium oxide source (690°–780° C.) than for the soaking of the precursor deposit with thallium (840°–900° C.).

The carrier gas that carries the thallium oxide vapor to the substrate and precursor is generally 1 atmosphere oxygen. Mixtures of oxygen and nitrogen or oxygen and argon with about 15–100 volume percent oxygen can also be used as the carrier gas.

After reaction soaking the precursor at about 860° C.±5° C. at a thallium oxide vapor pressure of between about $5\times10^{-4}$ to $5\times10^{-3}$ atmospheres for about 26 minutes, the precursor now containing thallium is cooled in the reactor with a lower thallium oxide vapor pressure, which generally is less than 10-3 atmospheres.

Referring now to FIGS. 1*a,* 1*b,* and 2, the following descriptions and examples further demonstrate embodiments of the invention. Continuous processing of long lengths of precursor tape to make thallium superconductors are illustrated schematically in FIGS. 1*a,* 1*b,* and 2, respectively. In each embodiment, provision is made to insure the appropriate exposure to thallium oxide partial pressure during each step of the process: warming, reaction soak, and cooling.

Turning to FIG. 1*a,* a single slit reactor 8 is depicted. A single slit apparatus is one that has a single slit in the anterior of the reaction chamber, prior to the precursor entering the reaction soak zone. A resistance heated tube furnace with an inner alumina reaction tube can be used. The reactor 8 has two separate heaters for temperatures 860° C.±5° C. (9) and 730° C.+5° C. (10), where the heater 9 heats the temperature used for warming the precursor to about 860° C.±5° C. in the precursor warming zone 9' and is also used at 860° C.±5° C. for the reaction soak zone 9". The second heater 10 is used to heat the thallium oxide source 6 to about 730° C.±5° C. to control the thallium oxide vapor partial pressure in the reactor soak zone 9". Thermocouples 30, 31, 32, and 33 may be placed in the reactor 8 in the following areas: the precusor warming zone 9' to monitor the temperature at about 860° C.±5° C. 30; in the reaction soak zone 9" to monitor the temperature at about 860° C.±5° C. 31; in the thallium flow tube 10' to monitor the thallium source 6 temperature at about 730° C.±5° C. 32; and in the cooling zone 3 to monitor the temperature below about 600° C. 33. The reactor 8 is equipped with a precursor entrance 11 or frontal opening 11 in the precursor warming zone 9' and a thallium source loading door 12 in the thallium flow tube 10'. The reactor 8 has a reaction chamber 8' operatively connected within the reactor 8. The reaction chamber 8' is generally an alumina tube or other material that is non-reactive with thallium oxide vapors. The reaction chamber 8' has slits located in the anterior position 5 and the posterior position 5' so that the precursor tape can enter the reaction chamber 8' from the precursor warming zone 9' through the anterior slit 5 and exit reaction chamber 8' through the posterior slit 5'. The reactor chamber 8' is divided into two heating zones, the first reaction soak zone 9" that has a temperature of about 860° C.±5° C. and is located in the anterior position in the reaction chamber 8' and a second reaction soak zone 9'" that has a temperature of about 730° C.±5° C. and is located in the posterior position of the reaction chamber. The reactor 8 also is equipped with an oxygen valve 13 to flush the precursor warming zone 9' with oxygen prior to the reaction soak. The oxygen valve controls the oxygen atmosphere 2 present in the precursor warming zone 9' and serves to flush the precursor tape 1 prior to the tape 1 entrance into the reaction chamber 8'. Other valves may be placed in the reactor 8 for other gases if desired. For processing of long lengths of the substrate coated with the precursor, herein described as precursor tape 1, the precursor tape 1 is freely exposed to the surrounding oxygen atmosphere 2 in the precursor warming zone 9'. A means, such as a motor 29, for moving the tape 1 through reactor 8 from the frontal entrance 11 to the exit 11' is positioned anterior to the reactor's 8 frontal opening 11. The precursor tape can be on a reel 28 located outside the frontal entrance 11 of the reactor 8. The precursor tape 1 travels through the precursor warming zone 9', passes through the anterior slit 5 of the reaction chamber 8' where the precursor tape is reacted with the thallium oxide vapor in the first reaction soak zone 9'' and the second reaction soak zone 9''', exits the reaction chamber 8' through a posterior slit 5' in the reaction chamber 8', passes through a cooling zone 3, and exits at the rear of the reactor 8 through the exit 11' and then onto a take-up spool 28'. It is noted that fans may be used to insure sufficient transport of thallium oxide vapor to all of the precursor tape 1 surface in the reaction zones 9'' and 9'''. The design of the slit 5 should be such as to minimize leaking of thallium oxide vapor into the warming zone 9'. In the precursor warming zone 9', pure oxygen gas flow 2 removes thallium oxide vapor which may leak from slit 5 and further insures that no reaction of the precursor tape 1 with thallium oxide vapor in the precursor warming zone 9'. Subsequently, once the precursor tape 1 reaches the reaction temperature of 860° C.±5° C. in the warming zone 9', the the tape 1 is passed through the slit 5. The oxygen carrier gas flow 7 in the thallium flow tube 10' convectively transports thallium oxide vapor into the vicinity of the precursor tape 1 in the reaction soak zones 91'' and 9'''. The partial pressure of the thallium oxide vapor is controlled by the thallium source 6 temperature at about 730° C.±5° C. The tape 1 may be exposed to the thallium oxide vapor for about 26 minutes. Shorter or longer time periods of exposure to the thallium oxide vapor during the reaction step are determined by one skilled in the art based on the thickness of the precursor coating and the speed that the tape passes through the reaction zone 9''. During the cooling step 3, after the reaction zone 9'', the source 6 temperature and oxygen carrier gas 7 flow are adjusted to reduce the partial pressure of thallium oxide at the appropriate rate, below about $10^{-3}$ atm., so as to achieve the correct thallium content and microstructure in the superconducting tape 1'. An exhaust duct 14 is also available in the cool zone 3 to help achieve cooling and proper thallium oxide vapor pressure. The reacted superconducting tape 1' may be removed and cooled outside the reactor 8 if desired to minimize post reaction take-up of thallium in the superconductor.

FIG. 1*a*'s schematic representation of the single anterior slit apparatus serves to create a region where the partial pressure of thallium oxide vapor is below about $10^{-4}$ atm. during the precursor tape warming zone. Because of its relative simplicity, the single slit apparatus is useful for rapid processing of precursor tape to form the thallium-containing superconductor. For example, good critical current can be obtained after a total process time of 23 minutes in the single slit apparatus using a step pull-through protocol. This entails that in 0.5 minutes, the precursor tape is brought from its initial room temperature position to a position inside the reactor and just to the left of the slit, using FIG. la as a demonstration. After waiting about one minute for the precursor tape to warm to about 860° C. in the warming zone, the precursor tape is quickly brought through the slit and allowed to react with the thallium oxide vapor during the reaction period. The thallium oxide vapor partial pressure during the reaction is controlled by the source temperature of the thallium source ($Tl_2O_3$) and is about $5\times10^{-4}$ to about $5\times10^{-3}$ atmospheres. The tape's temperature during the reaction is about 860° C.±5° C. Last, the thallium-containing superconductor tape is rapidly cooled by pulling it from the furnace in about one minute to avoid excess thallium loading.

Samples Tl216–Tl226, listed in Table 1, used the step pull-through protocol in the single-slit apparatus. The first series looked at the dependence of the thallium content on the reaction time. The thallium content of the film was found to saturate at about ten minutes. A notable result in Table 1 is the observation of critical current density over 20 kA/cm$^2$ for some segments of the sample Tl224, which was obtained for a total processing time of only 7.5 minutes. These results also demonstrate that the mass transport of thallium oxide from its source to the precursor tape is a rate limiting step.

Figure 1B:
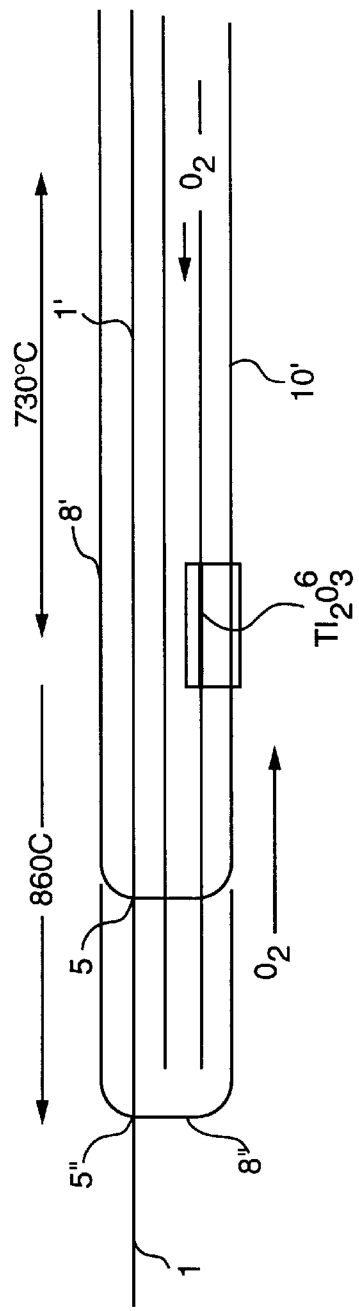

Another embodiment of the invention is a double slit apparatus which demonstrates continuous processing of precursor tape to make long lengths of thallium-containing superconductors. By a double slit apparatus is meant that there are two anterior slits that the precursor tape needs to pass through. It has been found that for a sample which was brought through the furnace at a constant velocity of about 0.17 cm/min, and fast cooled in about one minute, that a critical current of 70±25 kA/cm$^2$ was observed. This result was obtained for superconductor films on flexible yttria stabilized zirconia substrates. FIG. 1*b* demonstrates the double slit apparatus for continuous processing of precursor tape 1. This apparatus is similar to FIG. 1*a* except that there are two tubes connected after the precursor warming zone 9', so that the precursor tape 1 passes through a first slit 5'' into a first tube 8'', located anterior to the chamber 8'. The partial pressure of thallium oxide vapor in first tube 8'' is established by convective transport from the thallium source 6 through the thallium flow tube 10' using oxygen as the carrier gas 7. The thallium flow tube 10' extends through the chamber 8' and into the first tube 8''. The first tube 8'' may contain thallium oxide vapor in the range $5\times10^{-4}$ to $5\times10^{-3}$ atmosphere. At a continuous speed, the precursor tape 1 travels through the first tube 8'' and continues to pass through the second slit 5 located in the anterior position of the reaction chamber 8'. In all other aspects, the process is similar to that described for FIG. 1*a*.

A series of experiments were performed in the double slit apparatus shown in FIG. 1*b*. The results are given in Table 1. Initially, four samples Tl227–Tl231 were run in the apparatus using the step pull-through protocol. It was learned that the two tubes in FIG. 1*b* need to be positioned in contact in order to maintain an adequate vapor pressure of thallium oxide in the reaction zone. Sample Tl233 was run with a process which is intermediate between the constant velocity and step pull-through modes. A constant velocity was maintained for the warming and reaction steps. The sample was quickly cooled by withdrawing the sample from the furnace in one minute to avoid thallium overloading of the superconductor. For the given sample, the thallium content is in the desired range and the critical current was the highest and most uniform obtained on flexible yttria stabilized zirconia, $J_c$=70±26 kA/cm$^2$. The importance of this sample is that it shows that high critical current can be obtained from this type of apparatus.

Also shown in Table 1, sample Tl232 was run at a constant velocity from one side of the furnace to the other. The process conditions were the same as for sample Tl233. The thallium content of this sample was $Tl_x$=1.34. It appears that thallium loading during the cooling step was not completely avoided for this sample. However, one segment shows $J_c$=38.5 kA/cm$^2$. By fine adjustment of the position of the tubes in the reactor the thallium loading upon cooling can be avoided.

Although other designs are possible, the attractive aspects of those in FIG. 1*a* and 1*b* are their simplicity and the fact that they can be constructed from commercially available alumina tubes. Alumina is preferred since it does not interact with the thallium oxide vapor. However, any material which does not have an adverse reaction or is inert with the thallium oxide vapor can be used.

Figure 2:
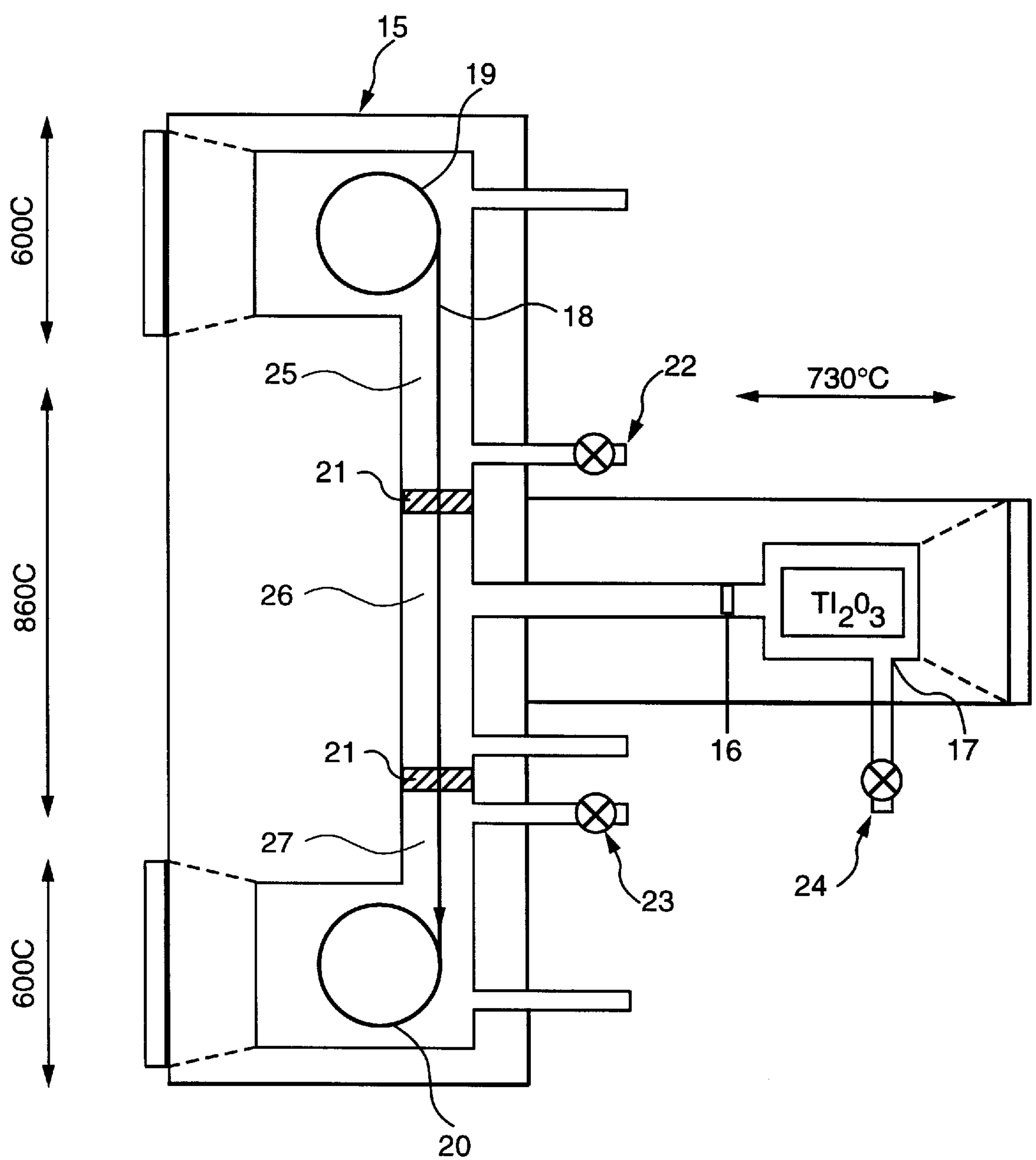
FIG. 2 depicts a top view of another embodiment of a continuous process for fabricating the thallium-containing superconductor of this invention.

Now referring to FIG. 2, a schematic diagram is shown depicting another embodiment of a reactor 15 for continuous processing of the thallium-containing superconductor. In the continuous process, a shutter 16 is used for isolating the thallium oxide source 17 and vapor during the warming of the precursor tape 18. The thallium oxide vapor pressure to which the tape 18 is exposed from reel 19 to uptake reel 20 is determined by an arrangement of slits 21 and oxygen gas flow 22 and 23. The thallium oxide vapor is carried by oxygen gas 24. Three independent gas flows are maintained in order to establish the appropriate atmosphere in the warming zone 25, the holding and reaction soak step 26, and the cooling step 27. During warm-up, the precursor tape 18 is flushed with pure oxygen 22. The design of the slits 21 should be such as to minimize the leaking of thallium oxide vapor into the warm-up zone. In the reaction zone 26, the thallium oxide vapor passes over the precursor tape. The partial pressure of the thallium oxide vapor is determined by the thallium source 17 temperature. In the cooling zone 27, the leakage past the slit 21 is mixed with additional pure oxygen 23 to insure the correct thallium content and microstructure in the superconducting tape.

The following examples further demonstrate this invention.

EXAMPLES

Polycrystalline, yttria-stabilized zirconia substrates ($3\%Y_2O_3$) were sprayed with an ultrasonically nebulized nitrate solution having cation stoichiometry $Ba_2Ca_2Cu_3Ag_{0.37}$. Substrate temperature during deposition was 275° C. The nitrate films were deposited as twelve layers with intermediate partial decompositions at 650° C for 5 minutes between deposition of each layer. The nitrate films were then fully decomposed in flowing oxygen using a stepped temperature ramp with final temperature 850° C. followed immediately by a furnace cool.

The resulting precursor tapes were then reacted with thallium oxide vapor in a continuous reactor in which the temperature ramps of the precursor warm-up and the thallium source zones were independently controlled. An oxygen flow of approximately 10 sccm was passed through a baffled chamber containing the source and provides convective transport of thallium oxide vapor to the precursor tape. The final thallium content of the reacted films was influenced by the partial pressure of thallium oxide during this process.

The temperature time schedule for the precursor tape warm-up zone was identical for all the samples studied and consisted of a ramp to 860° C., a soak (reaction) at 860° C., and a rapid cool below about 600° C. The thallium content of the films was determined gravimetrically, with an average index x in the formula, $Tl_xBa_2Ca_2Cu_3O_9$, where $0.69<x<0.85$.

Films having the c-axis perpendicular to the plane of the substrate were obtained for the thallium oxide source temperature ($T_s$) in the range 725–730° C. The thallium content was about $0.69<x<0.85$. Following reaction with thallium and cooling, all samples were patterned for four-point transport measurements and then post-annealed for 8 hours at 600° C. in an oxygen ambient.

Table 1 gives results from samples processed by the method of this invention. The precursor samples were warmed to 860° C. before exposure to thallium oxide vapor. High critical currents were obtained for 30 second warming times. The thallium-barium-calcium-copper oxide superconductor(1223) grains were oriented with the c-axis perpendicular to the plane of the substrate. Electrical transport results are also indicated in Table 1. Samples which are brought from room temperature to 860° C. in 30 seconds have high $J_c$ if the thallium oxide vapor pressure is kept low enough. To obtain a highly textured microstructure and high critical current, it is desirable to react under conditions where nucleation of Tl(1223) grains are initially restricted to the film/substrate interface.

TABLE I

| continuous velocity | | | | | | | | | |
|---|---|---|---|---|---|---|---|---|---|
| sample | source (C) | smple (C) | flow sccm | soak (min) | Tix | area (sμm) | d (μm) | R(295) (Ω) | Tc (K) |
| two-step, control sample 4B15 furnace | | | | | | | | | |
| ss874 | | | | | | 5500 | 2.8 | 9.34 | 105.5 |
| stepped pull-through, single slit, soak time dependence | | | | | | | | | |
| TL216 | 732 | 863 | 20 | 20 | 0.91 | 5500 | " | 9.60 | 113.5 |
| 217 | 730 | " | " | 20 | 0.91 | 5500 | " | 8.21 | 113.5 |
| 218 | 728 | " | " | 20 | 0.84 | 5500 | " | 12.37 | 113.0 |
| 219 | " | " | " | 10 | 0.85 | 5500 | " | 10.72 | 111.0 |
| 220 | " | " | " | 5 | 0.72 | 5500 | " | 64.00 | 99.0 |
| 221 | " | " | " | 3 | 0.46 | | | | |
| 222 | " | " | " | 0 | 0.19 | | | | |
| stepped pull-through, single slit, flow dependence | | | | | | | | | |
| 223 | 728 | 863 | 1.8 | 5 | 0.00 | | | | |
| 225 | " | " | 11 | " | 0.37 | | | | |
| 220 | " | " | 20 | " | 0.72 | 5500 | " | 64.00 | 99.0 |
| 226 | " | " | 55 | " | 0.93 | 5500 | " | 10.16 | 109.5 |
| 224 | " | " | 100 | " | 0.88 | 5500 | " | 13.10 | 107.0 |
| stepped pull-through, double slit | | | | | | | | | |
| 228 | 728 | 863 | 20 | 20 | 0.35 | 5500 | " | 14.86 | 109.5 |
| 231 | 730 | " | " | 34 | 0.51 | 5500 | " | 8.67 | 112.0 |
| constant velocity, double slit, 6 cm/35 min, quick cool | | | | | | | | | |

TABLE I-continued

| continuous velocity | | | | | | | | | |
|---|---|---|---|---|---|---|---|---|---|
| 233 | 732 | 863 | 20 | 26** | 0.65 | 5500 | " | 9.06 | 108.0 |
| constant velocity, double slit, 41 cm/240 min | | | | | | | | | |
| 232 | 732 | 863 | 20 | 45* | 1.34 | 5500 | " | 8.97 | 113.0 |

| | Critical Current Density(kA/cm^s) | | | | | | | Ic(Amps) | | | | |
|---|---|---|---|---|---|---|---|---|---|---|---|---|
| sample | ae | ab | bc | cd | de | Ave | dev | ae | ab | bc | cd | de |
| two-step, control sample, 4B15 furnace | | | | | | | | | | | | |
| ss874 | 12.4 | 18.7 | 18.2 | 14.5 | 12.4 | 16.0 | 3.0 | 0.68 | 1.03 | 1.00 | 0.80 | 0.68 |
| stepped pull-through, single slit, soak time dependence | | | | | | | | | | | | |
| TL216 | 0.1 | 25.1 | 0.1 | 0.1 | 0.1 | 6.3 | 12.5 | 0.00 | 1.38 | 0.01 | 0.01 | 0.00 |
| 217 | 18.7 | 20.0 | 19.1 | 33.6 | 31.8 | 24.2 | 8.1 | 1.03 | 1.10 | 1.05 | 1.85 | 1.75 |
| 218 | | 30.0 | 49.1 | 26.4 | | 35.2 | 12.2 | | 1.65 | 2.70 | 1.45 | |
| 219 | | 40.0 | 26.4 | 20.9 | | 29.1 | 9.8 | | 2.20 | 1.45 | 1.15 | |
| 220 | 0.1 | | | | | 0.1 | | 0.01 | | | | |
| 221 | | | | | | | | | | | | |
| 222 | | | | | | | | | | | | |
| stepped pull-through, single slit, flow dependence | | | | | | | | | | | | |
| 223 | | | | | | | | | | | | |
| 225 | | | | | | | | | | | | |
| 220 | 0.1 | | | | | 0.1 | | 0.01 | | | | |
| 226 | 12.4 | 23.3 | 12.4 | 17.3 | 17.3 | 17.5 | 4.5 | 0.68 | 1.28 | 0.68 | 0.95 | 0.95 |
| 224 | 3.4 | 21.6 | 4.9 | 3.1 | 10.7 | 10.1 | 8.4 | 0.19 | 1.19 | 0.27 | 0.17 | 0.59 |
| stepped pull-through, double slit | | | | | | | | | | | | |
| 228 | 3.3 | 3.8 | | | 4.4 | 4.1 | 0.4 | 0.18 | 0.21 | | | 0.24 |
| 231 | 0.0 | 4.5 | 8.2 | 12.7 | 0.0 | 6.4 | 5.4 | 0.00 | 0.25 | 0.45 | 0.70 | 0.00 |
| constant velocity, double slit, 6 cm/35 min, quick cool | | | | | | | | | | | | |
| 233 | | 34.5 | 89.1 | 89.1 | 67.3 | 70.0 | 25.8 | | 1.90 | 4.90 | 4.90 | 3.70 |
| constant velocity, double slit, 41 cm/240 min | | | | | | | | | | | | |
| 232 | | 15.5 | 38.5 | 1.8 | | 18.6 | 18.6 | | 0.85 | 2.12 | 0.10 | |

*7.5 cm/(0.17 cm/min)
**4.5 cm/(0.17 cm/min)

What is claimed:

1. An apparatus for making thallium-containing superconductors comprising:
   - a reactor;
   - a precursor warming zone in an anterior position of said reactor;
   - a reaction chamber, having a slit at an anterior position and a slit at a posterior position for sealingly transporting a substrate therethrough having a coated precursor thereon, and operatively connected to the reactor and positioned centrally in the reactor and proximate to said precursor warming zone, and including a reaction soak zone for reacting therein thallium oxide vapor with said substrate coated with said precursor;
   - a thallium flow tube having an anterior open end proximate to the anterior of the reaction chamber, operatively connected and positioned within the reaction chamber;
   - a thallium source positioned in the thallium flow tube;
   - impermeable heating means operatively positioned proximate to the precursor warming zone, the reaction soak zone, and the thallium source;
   - means for flushing the precursor warming zone with oxygen; and
   - means for flow of oxygen carrier gas for thallium oxide vapor in the thallium flow tube and into said reaction soak zone.

2. An apparatus according to claim 1 further comprising means including .thermocouples to control the temperature of the precursor warming zone at about 860° C.±5° C., the reaction soak zone at about 860° C.±5° C., and the thallium source at about 730° C.±5° C.

3. An apparatus according to claim 1 where the reactor has a means for cooling thallium-containing superconductor to below about 600° C. with thallium oxide vapor pressure less than $10^{-3}$ atmospheres.

4. An apparatus according to claim 1 further comprising means for transporting a precursor tape through said reaction chamber to make thallium-containing superconductor.

5. An apparatus according to claim 4 where the precursor tape is continuous and extends through said reactor and reaction chamber slits.

6. An apparatus for forming a superconductor comprising:
   - means for transporting a continuous tape precursor sequentially in portions through first, second, and third zones;
   - means for sealing said second zone from said first and third zones while allowing said precursor to be transported therethrough;
   - means for warming said precursor in said first zone;
   - means for delaying exposure of said precursor to said vapor between said first and second zones until said precursor is warmed to a predetermined temperature for receiving a stoichiometric amount of thallium from said vapor;

means for reaction soaking said precursor with a thallium oxide vapor in said second zone;

means for cooling said precursor in said third zone; and means for effecting different vapor pressures in each of said first, second, and third zones, wherein said vapor pressure increases between said first and second zones.

7. An apparatus according to claim 6 wherein said transporting means are effective for intermittently step transporting said tape through said first, second, and third zones, with a waiting period without motion in said first zone.

8. An apparatus according to claim 6 wherein said transporting means are effective for transporting said tape at constant velocity through said first, second, and third zones in continuous transport.

9. An apparatus for forming a superconductor comprising:

a housing;

a reaction chamber disposed inside said housing to define a reaction soak zone therein, and warming and cooling zones outside opposite ends of said chamber inside said housing;

a flow tube disposed inside said reaction chamber, and having an inlet and an outlet at opposite ends, with said outlet being disposed in flow communication with said reaction soak zone;

means disposed in said flow tube for producing a thallium oxide vapor;

means for transporting a precursor in sequence through said warming zone, said reaction soak zone, and said cooling zone;

first means for heating said precursor in said warming zone to a first temperature;

second means for heating said vapor producing means to a second temperature less than said first temperature;

means for carrying said vapor through said flow tube and into said reaction soak zone for deposition on said precursor therein;

means for flushing oxygen through said warming zone to substantially free said warming zone of said vapor; and means for cooling said precursor in said cooling zone for producing said superconductor.

10. An apparatus according to claim 9 wherein said reaction chamber is substantially closed, and includes inlet and outlet slits at opposite ends thereof sized to conform with said precursor for transport therethrough.

11. An apparatus according to claim 10 wherein said first heating means are positioned to heat a first portion of said precursor in said warming zone, and a second portion of said precursor in said reaction soaking zone to said first temperature.

12. An apparatus according to claim 11 wherein said second heating means are positioned to heat a third portion of said precursor in said reaction soaking zone to said second temperature.

13. An apparatus according to claim 10 further comprising means for effecting different vapor pressures in each of said warming, reaction soak, and cooling zones.

14. An apparatus according to claim 13 wherein said vapor pressure increases between said warming and reaction soak zones.

15. An apparatus according to claim 10 wherein said reaction chamber comprises:

a first tube disposed in series with a second tube, with said flow tube extending through said second tube and into said first tube to position said flow tube outlet therein;

said first tube includes a first slit for first receiving said precursor; and said second tube includes a second slit aligned with said first slit for receiving said precursor to maintain vapor pressure in said reaction soaking zone.

* * * * *